United States Patent [19]

Horne et al.

[11] Patent Number: 5,796,651
[45] Date of Patent: Aug. 18, 1998

[54] MEMORY DEVICE USING A REDUCED WORD LINE VOLTAGE DURING READ OPERATIONS AND A METHOD OF ACCESSING SUCH A MEMORY DEVICE

[75] Inventors: Stephen C. Horne, Austin, Tex.; Richard K. Klein, Mountain View, Calif.; Asim A. Selcuk, Cupertino, Calif.; Nicholas John Kepler, Saratoga, Calif.; Christopher A. Spence; Raymond T. Lee, both of Sunnyvale, Calif.; John C. Holst, San Jose, Calif.

[73] Assignee: Advanced Micro Devices, Inc., Sunnyvale, Calif.

[21] Appl. No.: 858,589

[22] Filed: May 19, 1997

[51] Int. Cl.$^6$ .................. G11C 11/418; G11C 11/419
[52] U.S. Cl. ............ 365/156; 365/154; 365/230.06; 365/189.11; 365/190
[58] Field of Search .................. 365/156, 154, 365/230.06, 189.09, 189.11, 190

[56] References Cited

U.S. PATENT DOCUMENTS

5,570,312  10/1996  Fu ........................... 365/154
5,633,832  5/1997  Patel et al. ............ 365/230.06

*Primary Examiner*—David C. Nelms
*Assistant Examiner*—Andrew Q. Tran
*Attorney, Agent, or Firm*—Foley & Lardner

[57] ABSTRACT

A memory device uses a reduced word line voltage during READ operations. The memory device includes a memory cell and a pass transistor for accessing the cell. The cell includes a storage node coupled to a pull-down transistor having substantially the same conductivity as the pass transistor. A drive circuit generates a reduced word line voltage to activate the pass transistor during a READ operation. The reduced word line voltage has a magnitude less than the magnitude of the bias voltage used to activate the pull-down transistor.

20 Claims, 5 Drawing Sheets

MEMORY DEVICE USING A REDUCED WORD LINE VOLTAGE DURING READ OPERATIONS AND A METHOD OF ACCESSING SUCH A MEMORY DEVICE

FIELD OF THE INVENTION

The present invention relates generally to a semiconductor memory device and, in particular, to a semiconductor memory device having a reduced word line voltage.

BACKGROUND OF THE INVENTION

More sophisticated technology has created a heightened demand for smaller, faster semiconductor devices incorporating an ever increasing number of components. An area of special interest is semiconductor memory devices, such as a read only memory (ROM), a dynamic random access memory (DRAM) and a static random access memory (SRAM), having greater storage capacity.

Such memory devices typically include a number of memory cells accessed by a pass transistor coupled to at least one bit line. The memory cells often include at least one storage device coupled to a storage node. Generally, memory cells include two storage devices, such as storage transistors, each coupled to one of a pair of complementary storage nodes which are accessed by two pass transistors. Each pass transistor is further coupled to a bit line. Thus, each memory cell is often located between two complementary bit lines.

The pass transistors have gate electrodes coupled to a word line. A signal such as an address or SELECT signal is provided on the word line associated with the memory cell to select or access the memory cell. Once selected via the word line, the memory cell can be read or written to through the pass transistors via the bit lines.

To increase the storage capacity of such memory devices, a greater number of individual memory cells as well as the additional components required to access the added cells must be incorporated. Because available area within a memory device is at a premium, the physical layout of the components must become more compact and the physical dimensions of each component must be decreased to prevent the overall dimensions of the memory device from growing excessively large.

The need to optimize the use of available physical area is especially critical in SRAM devices in which a typical memory cell includes four transistors accessed by two pass transistors coupled between a pair of complementary bit lines. Although space optimization may be accomplished, at least in part, by fabricating smaller components, decreasing physical dimensions must always be balanced against detrimentally affecting circuit performance. Accordingly, a need exists for a technique for reducing cell size such that the dimensions of at least some of the memory cell components can be reduced without compromising circuit performance. This need may be addressed by an innovative technique involving modifying the drive circuit used to access the memory cells.

SUMMARY OF THE INVENTION

The invention provides an innovative memory device and a method for accessing such memory device in which a drive circuit used to access the memory cells is configured to apply a reduced voltage to a word line associated with each memory cell to read data stored in the cell. The reduced voltage allows for a reduction in cell size because the physical dimensions of a pull-down transistor in the cell can be reduced to a size substantially the same as a pass transistor associated with the cell.

Accordingly, in a first aspect of the invention, a memory device comprises a memory cell configured to store one of a HIGH voltage state and a LOW voltage state. The memory cell includes a storage node and a pull-down transistor coupled to the storage node. The pull-down transistor is configured to hold the storage node at the LOW voltage state when a bias voltage sufficient to activate the pull-down transistor is applied. The memory device further comprises a bit line associated with the memory cell and a pass transistor coupled between the bit line and the storage node. The pass transistor, which has substantially the same conductivity as the pull-down transistor, is coupled to an output of a drive circuit. The drive circuit applies a READ voltage having a magnitude sufficient to activate the pass transistor but which is less than the magnitude of the bias voltage applied to activate the pull-down transistor.

In accordance with another aspect of the invention, a method for accessing a memory cell is provided. The memory cell includes a bit line, a storage node for holding one of a HIGH voltage state and a LOW voltage state, a pull-down transistor coupled to the storage node, and a pass transistor coupled between the bit line and the storage node. The pass transistor has substantially the same conductivity as the pull-down transistor. A bias voltage is applied to the pull-down transistor such that the pull-down transistor holds the storage node at the LOW voltage state. A READ voltage is generated having a magnitude less than the magnitude of the bias voltage. The READ voltage is applied to the pass transistor such that the pass transistor couples the bit line to the storage node. The reduced magnitude of the READ voltage relative to the magnitude of the bias voltage allows reduction of the physical size of the pull-down transistor.

In accordance with yet another aspect of the invention, an SRAM memory device comprises an SRAM memory cell for storing data bits having HIGH and LOW voltage states, a pair of bit lines, a word line, a pair of pass transistors, and a drive circuit. The memory cell includes a complementary pair of storage nodes and a pair of pull-down transistors configured such that one the storage nodes is held at the LOW voltage state. The pass transistors have gates coupled to the word line, are each coupled between a bit line and a storage node, and have substantially the same conductivity as the pull-down transistors. The drive circuit is configured to generate a READ voltage at an output which is applied to the gates of the pass transistors. The magnitude of the READ voltage is less than the magnitude of the HIGH voltage state.

BRIEF DESCRIPTION OF THE DRAWINGS

The present invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
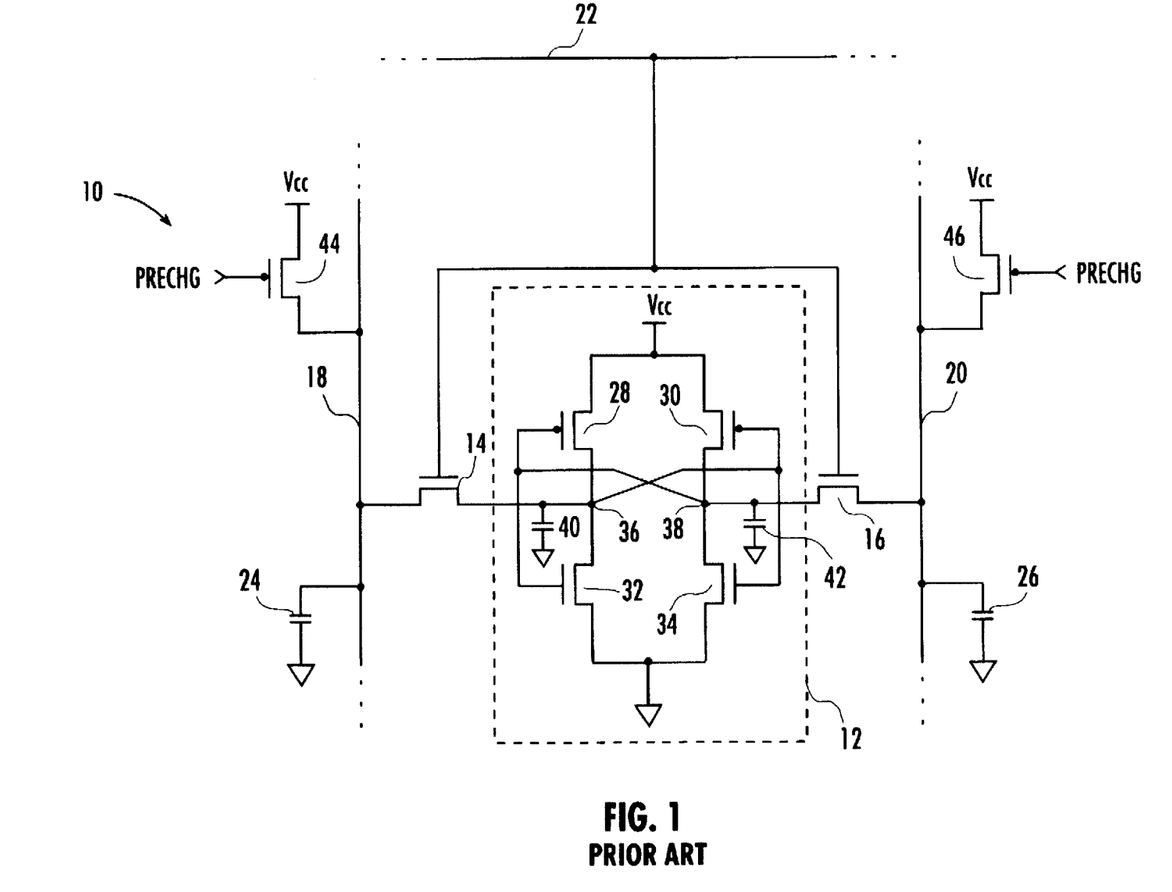
FIG. 1 is an electrical schematic diagram illustrating a typical SRAM memory cell known in the prior art.

Turning now to the drawings, and in particular to FIG. 1, a memory unit 10 of a typical static random access memory ("SRAM") device known in the prior art is illustrated. The electrical schematic of the prior art device is identical to the electrical schematic of a preferred embodiment of a memory device in accordance with the invention. Further, the electrical operation of both the prior art device and the preferred embodiment are generally similar. Accordingly, the following description of FIG. 1 applies to both the prior art and a preferred embodiment, unless otherwise indicated.

Memory unit 10 includes a four transistor memory cell 12, a pair of pass transistors 14, 16 to access cell 12, a pair of complementary bit lines 18, 20 to carry data to and from cell 12, and a word line 22 used to access cell 12. A typical SRAM device includes a column of memory units 10 coupled between complementary bit lines 18, 20 and a row of memory units 10 coupled to word line 22. The rows and columns are repeated multiple times to form an array of memory units 10. As the number of memory units 10 in a column increases, the length of bit lines 18, 20 also increases. Bit line length, in turn, results in an increased magnitude of parasitic capacitances (presented schematically by parasitic capacitors 24, 26) created between each bit line 18, 20 and ground.

Memory cell 12 includes load transistors 28, 30 and pull-down transistors 32, 34. Transistors 28, 30, 32, and 34 are coupled together to form cross-coupled inverters having complementary storage nodes 36, 38. Memory cell 12 also has associated parasitic capacitances (presented schematically by parasitic capacitors 40, 42) located between complementary storage nodes 36, 38 and ground, respectively. Memory cell parasitic capacitances 40, 42 typically are smaller in magnitude than bit line parasitic capacitances 24, 26.

In the prior art embodiment illustrated and in a preferred embodiment of the invention, load transistors 28, 30 are p-channel transistors, but may be replaced by polysilicon or other resistors, n-channel depletion mode transistors, or other electrical devices for pulling up the voltage at complementary storage nodes 36, 38 when pull-down transistors 32, 34 are not activated, respectively. In the prior art and in a preferred embodiment, pull-down transistors 32, 34 are n-channel enhancement mode transistors, although other types of transistors (e.g., bipolar transistors) or other devices may be utilized.

Storage node 36 is coupled to pass transistor 14 which is controlled by word line 22. Storage node 38 is coupled to pass transistor 16 which also is controlled by word line 22. In the prior art and in a preferred embodiment of the invention, pass transistors 14, 16 are n-channel enhancement mode transistors, although other types of transistors may be used.

In operation, memory cell 12 stores complementary data bits or voltage states representative of a HIGH logic state (i.e., VCC) and a LOW logic state (i.e., ground) on complementary storage nodes 36, 38. Typically, the HIGH logic state, or VCC, has a value of either 3.3V or 5V, although values less than 3.3V are also possible. When pull-down transistor 32 is activated, load transistor 30 is turned ON and pull-down transistor 34 and load transistor 28 are turned OFF. As a result, storage node 36 is coupled to ground and storage node 38 is coupled to VCC. Likewise, when pull-down transistor 34 is activated, load transistor 30 is turned ON and pull-down transistor 32 and load transistor 28 are turned OFF. Storage node 36 is then coupled to VCC, and storage node 38 is coupled to ground. Thus, the logic state stored on node 36 is the complementary of the logic state stored on node 38. Moreover, the HIGH logic state stored on one of nodes 36 and 38 provides the bias voltage necessary to activate one of pull-down transistors 32, 34 such that the complementary storage node 36 or 38 is maintained at the LOW logic state.

Memory cell 12 is accessed for reading from and writing to storage nodes 36, 38 when a SELECT signal is provided on word line 16. In the prior art device illustrated, the SELECT signal typically has a magnitude substantially equal to VCC. In the preferred embodiment of the invention, as will be described more fully below, the magnitude of the SELECT signal may have a magnitude less than VCC or may have multiple magnitudes depending on whether cell 12 is being read from or written to.

In both the prior art and a preferred embodiment of the invention, pass transistors 14, 16 provide access to cell 12 in response to the SELECT signal. When activated, pass transistors 14, 16 couple bit lines 18, 20 to complementary storage nodes 36, 38, respectively, for both WRITE and READ operations.

During the WRITE operation, pass transistors 14, 16 conduct complementary signals carried on bit lines 18, 20 to storage nodes 36, 38, respectively. After the SELECT signal on word line 22 is removed, memory cell 12 stores the complementary signals at storage nodes 36, 38. During the READ operation, the signals stored at storage nodes 36, 38 are read by a sense amplifier 50 (see FIG. 2) via bit lines 18, 20.

Complementary bit lines 18, 20 are further coupled to precharge transistors 44, 46, respectively. In both the prior art and a preferred embodiment of the invention, transistors 44, 46 are p-channel enhancement mode transistors configured to pull up bit lines 18, 20 to a selected voltage (preferably, VCC) in response to a precharge signal. Alternatively, other types of transistors or switching elements may be used to apply the selected voltage to bit lines 18, 20, and the selected voltage may have a value between VCC and ground.

Transistors 44, 46 precharge both bit lines 18, 20 to VCC, or some other selected voltage level, at the end of every READ or WRITE operation in response to a precharge signal applied by a precharge circuit (not shown). Precharging bit lines 18, 20 advantageously reduces the access time of cell 12 during READ operations. Precharging bit lines 18, 20 to the same voltage level (regardless whether VCC or some other voltage level) offers the further advantage of preventing destruction of data stored in a memory cell 12 accessed immediately after data is written to the previously accessed memory cell 12.

To illustrate the effect of precharging bit lines 18, 20, a READ operation of a memory cell 12, storing a LOW logic state (e.g., ground) at storage node 36 and a complementary HIGH logic state (e.g., VCC) at storage node 38 will now be described. At the start of the READ operation, bit lines 18, 20 are precharged to VCC, thus charging bit line parasitic capacitors 24, 26. When memory cell 12 is accessed by application of a READ signal on word line 22, pass transistors 24, 26 are activated, thus coupling complementary storage nodes 36, 38 and associated parasitic capacitors 40, 42 to bit lines 18, 20 and associated capacitors 24, 26, respectively. In this example, because bit line 20 is already charged to a voltage level, VCC, corresponding to the HIGH logic state held at storage node 38, the access time to read the data stored in memory cell 12 is reduced. In alternative embodiments, the bit lines may be precharged to a mid-level voltage, thus reducing the time required to transfer the stored data to both bit lines.

In the example just described, however, bit line 18 is precharged to VCC and storage node 36 is held at the LOW logic state (e.g., ground). To transfer the LOW logic state held at storage node 36, bit line parasitic capacitance 24 must be discharged through pass transistor 14 and pull-down transistor 32. However, due to charge sharing, the relatively larger bit line parasitic capacitor 24 will attempt to charge memory cell parasitic capacitor 40. If capacitor 24 succeeds in charging capacitor 40, cell 12 may change logic state, thus destroying the stored data.

Undesirable charge sharing may be prevented by ensuring that the drive strength of pull-down transistor 32 is great enough to overcome bit line capacitor 24, thus succeeding in holding storage node 36 at the LOW logic state. The memory devices of the prior art achieve this result by designing pull-down transistors 32, 34 to have a conductivity greater than the conductivity of pass transistors 14, 16. By having a greater conductivity, pull-down transistors 32, 34 can sufficiently conduct all the current that is passed through pass transistors 14, 16 so as to maintain the storage node at the LOW logic state, as appropriate.

The conductivity of a semiconductor transistor depends in part on the physical dimensions of the conductive region through which charge carriers move. For a channel device, the conductivity of the transistor is proportional to the ratio of the channel width to the channel length. To increase conductivity, the physical dimensions of the channel must increase, resulting in a device which consumes more physical area. Thus, pulldown transistors 32, 34 in prior art memory devices are physically larger than pass transistors 14, 16. Moreover, the pull-down transistors are physically larger than otherwise would be necessary if charge sharing between bit line capacitors 24, 26 and memory cell capacitors 36, 38 were not a concern.

The preferred embodiment of the present invention approaches the charge sharing problem in a different manner. Instead of controlling the relative conductivity of pass transistors 14, 16 and pull-down transistors 32, 34 by adjusting the channel dimensions, the magnitude of the READ voltage applied to activate pass transistors 14, 16 is reduced relative to the bias voltage (e.g., the HIGH logic state voltage level held at cross-coupled storage node 36 or 38) applied to activate pull-down transistor 32 or 34. Because of the bias voltage is larger than the READ voltage, pull-down transistor 32 or 34 can conduct more current than pass transistor 14 or 16 and, therefore, can maintain storage node 36 or 38 at the LOW logic state, as appropriate. Accordingly, the physical dimensions of pull-down transistors 32, 34 can be reduced to a size substantially the same as pass transistors 14, 16, resulting in an overall reduction in the size of the memory device.

Figure 2:
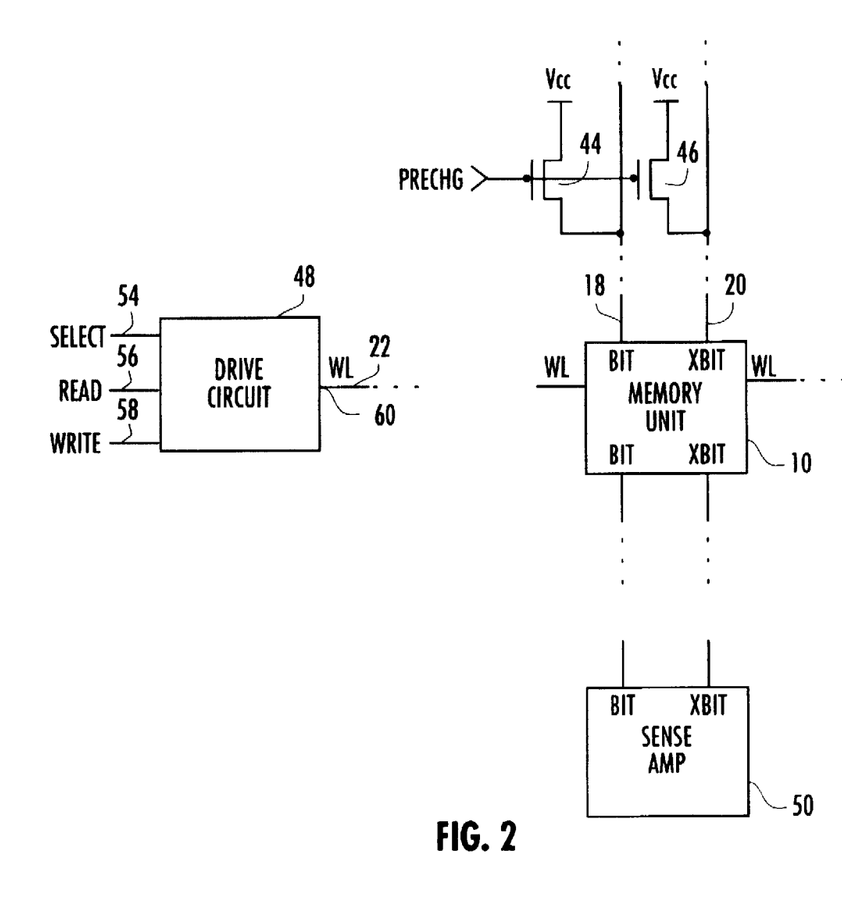
FIG. 2 is a block diagram of a portion of an exemplary embodiment of the memory device, illustrating a drive circuit, a memory cell and a sense circuit.

Turning now to FIG. 2, a block diagram of an exemplary embodiment of a portion 20 of a memory device in accordance with the present invention is provided, illustrating a drive circuit 48, memory unit 10 and a sense amplifier 50. Drive circuit 48 includes an address or SELECT input 54, a READ input 56, and a WRITE input 58. SELECT input 54 is configured to receive a SELECT signal representative of the address of the memory unit 10 to access. READ input 56 and WRITE input 58 receive READ and WRITE signals, respectively, indicating whether data should be read from or written to selected memory unit 10.

An output 60 of drive circuit 48 is coupled to word line 22 associated with memory unit 10. Although only one memory unit 10 is shown, it should be understood that word line 22 is associated with a plurality of memory units 10 arranged in a row. Similarly, FIG. 2 illustrates one memory unit 10 coupled between complementary bit lines 18, 20. It should be understood, however, that bit lines 18, 20 are coupled to multiple memory units 10 arranged in a column.

During a READ operation, the data read from a selected memory unit 10 is sensed by sense amplifier 50. During a WRITE operation, data carried on bit lines 18, 20 is transferred to memory unit 10. Immediately following each READ and WRITE operation, a precharge signal is applied to turn ON transistors 44, 46 to precharge bit lines 18, 20 to VCC.

Figure 3:
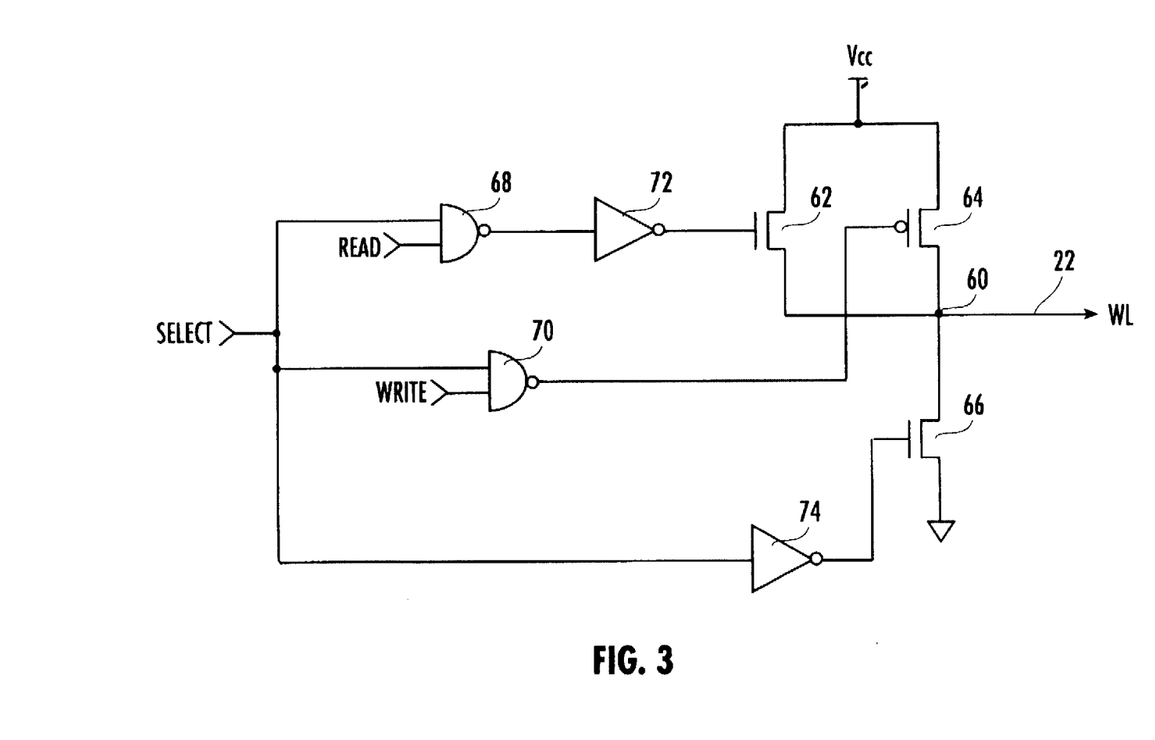
FIG. 3 is an electrical schematic representing an exemplary embodiment of the drive circuit of FIG. 2.

Referring now to FIG. 3, an electrical schematic of an exemplary embodiment of drive circuit 48 includes a pull-up transistor 62, a pull-up transistor 64, and a pull-down transistor 66 coupled to output 60, which couples an appropriate voltage to word line 22. Drive circuit 48 further includes NAND gates 68, 70, each having an input coupled to the SELECT signal. Another input of NAND gate 68 is coupled to the READ signal and another input of NAND gate 70 is coupled to the WRITE signal.

Upon receipt of the SELECT signal and the READ signal (e.g., logic HIGH levels), pull-up transistor 62 is activated via NAND gate 68 and inverter 72. Transistor 62 attempts to pull up output 60 to VCC. However, because transistor 62 preferably is an n-channel transistor, it inherently has difficulty pulling up to a voltage. Typically, in a 5V logic system, approximately 1 to 2 volts will be dropped across transistor 62, thus providing a voltage level at output 60 which is less than VCC. Alternatively, transistor 62 may be another type of switching device that will drop the appropriate amount of voltage such that voltage less than VCC is applied to output 60.

In summary, a READ voltage having a magnitude that is reduced relative to the bias voltage that activates pull-down transistors 32, 34 is applied to pass transistors 14, 16 associated with selected memory cell 12. As a result, pull-down transistors 32, 34 having substantially the same conductivity (e.g., the same size) as pass transistors 14, 16 will draw more current, thus ensuring that storage nodes 36, 38 will be maintained at the LOW logic state, as appropriate.

During the WRITE operation, charge sharing is not a problem because inadvertently changing the state of memory cell 12 is not a concern. Moreover, it is desirable that the WRITE voltage applied to the transistor have as large a magnitude as practical such that sufficient current is conducted to quickly charge or discharge storage nodes 36, 38 to the appropriate logic states. However, although the WRITE voltage has a larger magnitude (e.g., VCC) than the READ voltage in the preferred embodiment, the WRITE voltage alternatively may have substantially the same magnitude as the reduced READ voltage.

Accordingly, upon receipt of a SELECT signal and a WRITE signal (e.g., logic HIGH levels), pull-up transistor 64 pulls up output 60 to VCC. Because transistor 64 preferably is a p-channel transistor, it inherently is capable of pulling up to a voltage with very little voltage drop across the transistor. Thus, the voltage at output 60 will be very close to VCC. In alternative embodiments, transistor 64 may be any type of switching device that can couple to VCC without dropping substantial voltage across the device.

When the SELECT signal indicates that memory unit 10 is not selected (e.g., a logic LOW level), pull-down transistor 66 is turned ON via inverter 74, thus coupling output 60 to ground. Accordingly, pass transistors 14, 16, associated with each memory unit 10 in the row, will not be activated. Pull-down transistor 66 preferably is an n-channel transistor, but other switching elements may be used.

Figure 4:
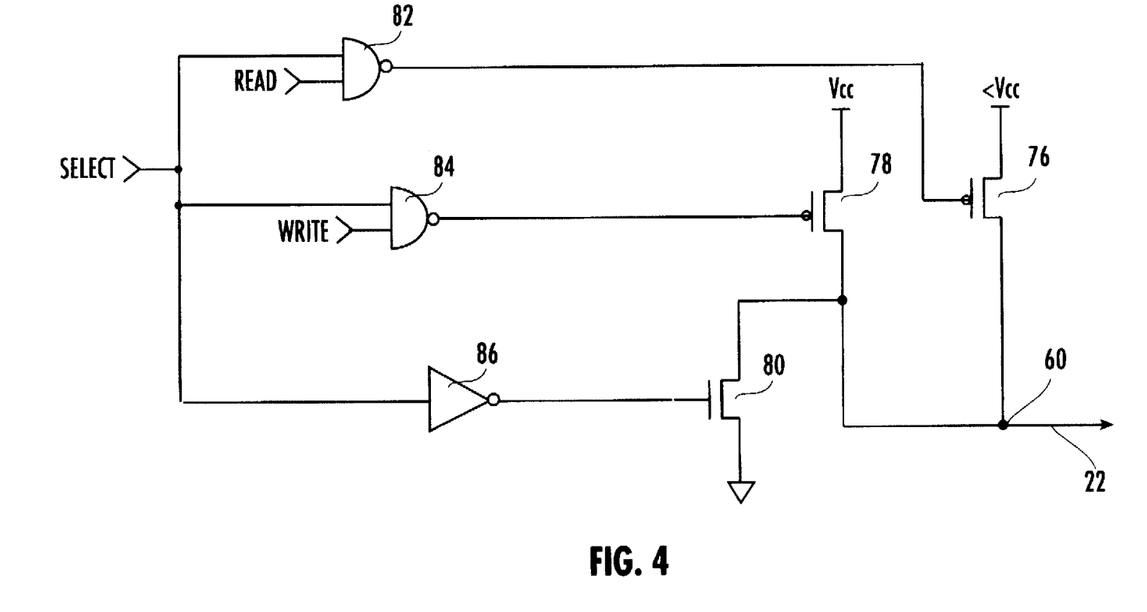
FIG. 4 is an electrical schematic of another exemplary embodiment of the drive circuit of FIG. 2.

Referring now to FIG. 4, an alternative embodiment of drive circuit 48 includes pull-up transistors 76, 78 and a pull-down transistor 80 coupled to output 60 for providing a voltage of the appropriate magnitude to activate pass transistors 14, 16 via word line 22. Circuit 48 further includes NAND gates 82 and 84 for activating pull-up transistors 76 and 78 in response to READ and WRITE signals, respectively.

Upon receipt of the READ and SELECT signals (e.g., logic HIGH levels), transistor 76 pulls up output 60 to a supply voltage selected to have a magnitude less than VCC. Preferably, in a 5V logic system, transistor 76 pulls up output 60 to approximately 1 to 2 volts less than VCC. Upon receipt of the WRITE and SELECT signals (logic HIGH levels), transistor 78 pulls up output 60 to approximately VCC. Because transistors 76 and 78 preferably are p-channel transistors, very little voltage will be dropped across transistors 76, 78 when in the conducting state. However, other types of switching elements may be used that will drop very little voltage when pulled up to VCC.

When the SELECT signal indicates that the associated memory unit 10 is not selected (e.g., a logic LOW state), pull-down transistor 80 is turned ON via inverter 86, thus coupling output 60 to ground. Accordingly, pass transistors 14, 16, associated with each memory unit 10 in the row, will not be activated. Transistor 80 preferably is an n-channel transistor.

Figure 5:
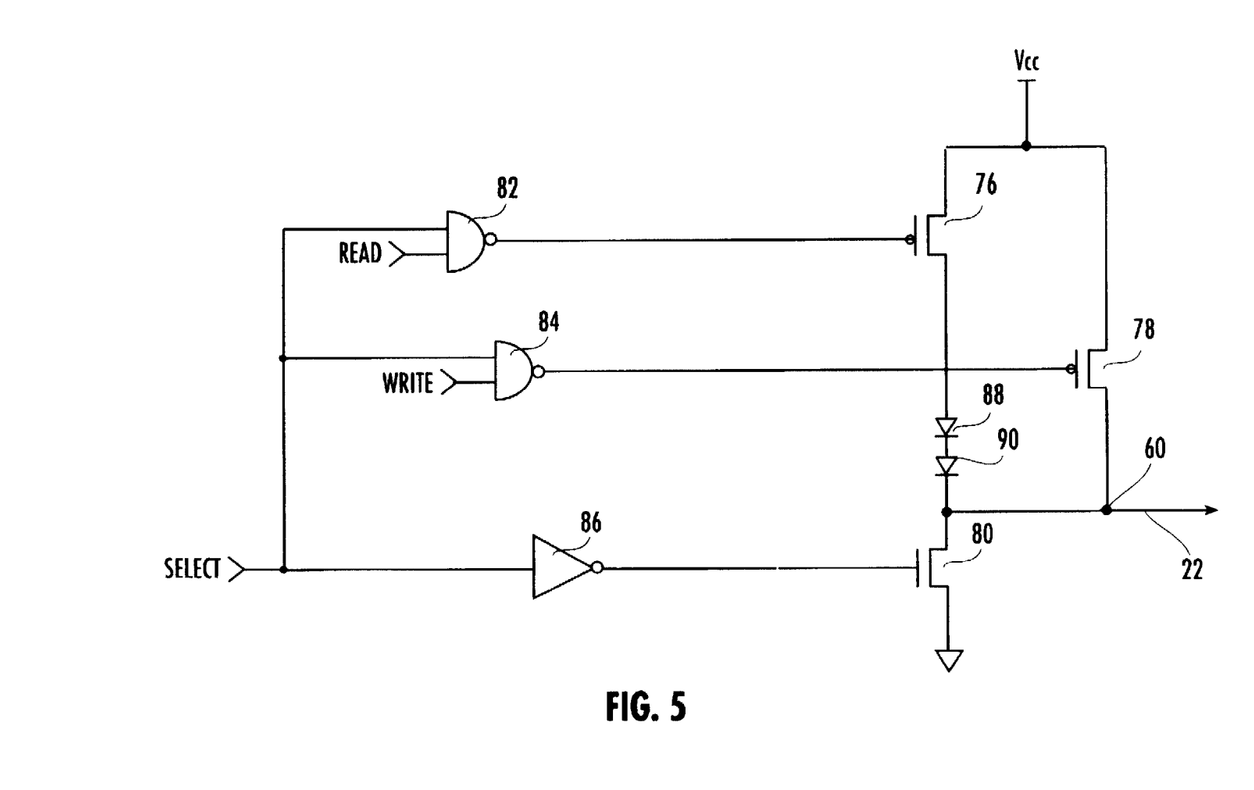
FIG. 5 is an electrical schematic of an alternative exemplary embodiment of the drive circuit of FIG. 2.

Referring to FIG. 5, an alternative embodiment of drive circuit 48 is illustrated. The embodiment of FIG. 5 operates in the same manner as described above with respect to FIG. 4, except that both pull-up transistors 76 and 78 pull up to VCC. However, when transistor 76 is activated in response to the READ signal, the voltage provided at output 60 has a magnitude less than VCC because of the voltage dropped across diodes 88 and 90.

While the embodiments illustrated in the Figures and described above are presently preferred, it should be understood that these embodiments are offered by way of example only. The invention is not intended to be limited to any particular embodiment, but is intended to extend to various modifications that nevertheless fall within the scope of the appended claims. For example, variants may include memory cells configured as DRAMs or ROMs. Also, various voltage levels have been discussed in an exemplary sense only. For example, the READ line voltage has been described as having a reduced magnitude relative to VCC. However, the READ line voltage may have any magnitude that is less than the bias voltage used to activate the pull-down transistors. Further many other variations of the drive circuit for applying a reduced word line voltage during a READ operation are easily envisioned.

What is claimed is:

1. A memory device, comprising:
   a memory cell configured to store one of a HIGH voltage state and a LOW voltage state, the memory cell including a storage node and a pull-down transistor coupled to the storage node, the pulldown transistor being configured to hold the storage node at the LOW voltage state upon application of a bias voltage sufficient to activate the pull-down transistor;
   a bit line associated with the memory cell to conduct the HIGH and LOW voltage states;
   a pass transistor coupled between the bit line and the storage node, the pass transistor having substantially the same conductivity as the pull-down transistor; and
   a drive circuit having an output coupled to the pass transistor for applying a READ voltage having a magnitude sufficient to activate the pass transistor, the magnitude being less than the magnitude of the bias voltage applied to activate the pull-down transistor.

2. The memory device as recited in claim 1, wherein the memory cell is configured as a static random access memory cell.

3. The memory device as recited in claim 1, wherein the drive circuit further applies a WRITE voltage to activate the pass transistor, the WRITE voltage having a magnitude substantially the same as the magnitude of the bias voltage applied to activate the pull-down transistor.

4. The memory device as recited in claim 3, wherein the drive circuit further comprises:
   a read input for receiving a READ signal; and
   a first switching element coupled to the drive circuit output and responsive to the READ signal, wherein the first switching element couples the READ voltage to the drive circuit output in response to the READ signal.

5. The memory device as recited in claim 4, wherein the drive circuit further comprises:
   a write input for receiving a WRITE signal; and
   a second switching element coupled to the drive circuit output and responsive to the WRITE signal, wherein the second switching element couples the WRITE voltage to the drive circuit output in response to the WRITE signal.

6. The memory device as recited in claim 5, wherein the first switching element is an n-channel transistor.

7. The memory device as recited in claim 5, wherein the magnitude of the READ voltage is at least one volt less than the magnitude of the WRITE voltage.

8. The memory device as recited in claim 6, wherein the second switching element is a p-channel transistor.

9. The memory device as recited in claim 5, wherein the drive circuit further comprises:
   a first supply voltage; and
   a second supply voltage having a magnitude greater than the magnitude of the first supply voltage;
   wherein the first switching element is coupled between the first supply voltage and the drive circuit output and the second switching element is coupled between the second supply voltage and the drive circuit output.

10. The memory device as recited in claim 1, wherein the memory device is part of a processor fabricated as an integrated circuit on a semiconductor substrate.

11. A method of accessing a memory cell including a bit line for conducting a HIGH voltage state and a LOW voltage state, a storage node for holding one of the HIGH voltage state and the LOW voltage state, a pull-down transistor coupled to the storage node, and a pass transistor coupled between the storage node and the bit line, the pass transistor having the same conductivity as the pull-down transistor, the method comprising:
   applying a bias voltage sufficient to activate the pull-down transistor such that the pull-down transistor holds the storage node at the LOW voltage state;
   generating a READ voltage having a magnitude less than the magnitude of the bias voltage; and
   applying the READ voltage to the pass transistor such that the pass transistor couples the bit line to the storage node, whereby the magnitude of the READ voltage relative to the magnitude of the bias voltage allows reduction of the physical size of the pull-down transistor.

12. The method as recited in claim 11, further comprising the steps of:

generating a WRITE voltage having a magnitude greater than the magnitude of the READ voltage; and applying the WRITE voltage to the pass transistor such that the pass transistor couples the bit line to the storage node.

13. The method as recited in claim 12, wherein the steps of generating a WRITE voltage and generating a READ voltage further comprise:

receiving a READ signal;

providing a first switching element to generate the READ voltage in response to the READ signal;

receiving a WRITE signal; and providing a second switching element to generate the WRITE voltage in response to the WRITE signal.

14. The method as recited in claim 13, wherein the first switching element is an n-channel transistor.

15. The method as recited in claim 14, wherein the second switching element is a p-channel transistor.

16. The method as recited in claim 11, wherein the magnitude of the READ voltage is at least one volt less than the magnitude of the bias voltage applied to activate the pull-down transistor.

17. The method as recited in claim 12, wherein the memory cell is part of a processor circuit fabricated on a semiconductor substrate.

18. An SRAM memory device, comprising:

an SRAM memory cell configured to store data bits having HIGH and LOW voltage states, the memory cell including:

a storage node;

a complementary storage node; and a pair of pull-down transistors, each pull-down transistor having a drain coupled to one of the storage node and the complementary storage node and a gate coupled to the other one of the storage node and the complementary storage node, wherein the pull-down transistors are configured to hold one of the storage node and the complementary storage node at the LOW voltage state;

a pair of bit lines associated with the memory cell to conduct the data bits;

a word line;

a pair of pass transistors having gates coupled to the word line, each pass transistor being coupled between one of the pair of bit lines and one of the storage node and the complementary storage node, wherein the pass transistors have substantially the same conductivity as the pull-down transistors; and a drive circuit having an output coupled to the word line, the drive circuit configured to generate a READ voltage to activate the pair of pass transistors, the READ voltage having a magnitude less than the HIGH voltage state.

19. The device as recited in claim 18, wherein the drive circuit is further configured to generate a WRITE voltage to activate the pair of pass transistors, the WRITE voltage having a magnitude greater than the magnitude of the READ voltage.

20. The device as recited in claim 18, wherein the magnitude of the READ voltage is at least one volt less than the magnitude of the HIGH voltage state.

* * * * *